US009248563B2

(12) United States Patent
Allner et al.

(10) Patent No.: US 9,248,563 B2
(45) Date of Patent: Feb. 2, 2016

(54) MACHINE TOOL HAVING A DRIVE MOTOR

(75) Inventors: Ralf Allner, Esslingen (DE); Thilo Koeder, Bayan Lepas (MY); Florian Esenwein, Uhingen-Holzhausen (DE); Manfred Lutz, Filderstadt (DE); Achim Trick, Sielmingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/516,119

(22) PCT Filed: Nov. 22, 2010

(86) PCT No.: PCT/EP2010/067879
§ 371 (c)(1),
(2), (4) Date: Aug. 27, 2012

(87) PCT Pub. No.: WO2011/072984
PCT Pub. Date: Jun. 23, 2011

(65) Prior Publication Data

US 2013/0033846 A1 Feb. 7, 2013

(30) Foreign Application Priority Data

Dec. 18, 2009 (DE) ........................ 10 2009 054 967

(51) Int. Cl.
*H05K 13/00* (2006.01)
*H02B 1/20* (2006.01)
*B25F 5/02* (2006.01)

(52) U.S. Cl.
CPC ........................................ *B25F 5/02* (2013.01)

(58) Field of Classification Search
CPC ........................................................ H02B 1/20
USPC ......................... 361/33, 760, 679.01–679.45, 361/679.55–679.61, 724–727, 728–747, 361/752–759, 796–837; 318/17, 491, 493, 318/494, 521, 538
See application file for complete search history.

(56) References Cited

U.S. PATENT DOCUMENTS

| | | | | |
|---|---|---|---|---|
| 4,835,410 | A * | 5/1989 | Bhagwat et al. | 307/64 |
| 5,115,175 | A * | 5/1992 | Fletcher | 318/280 |
| 5,350,317 | A * | 9/1994 | Weaver et al. | 439/500 |
| 6,144,122 | A * | 11/2000 | Covell et al. | 310/50 |
| 6,683,396 | B2 * | 1/2004 | Ishida et al. | 310/50 |
| 6,729,812 | B2 * | 5/2004 | Yaksich et al. | 408/240 |

(Continued)

FOREIGN PATENT DOCUMENTS

| | | | |
|---|---|---|---|
| CN | 1281382 | A | 1/2001 |
| CN | 1853870 | A | 11/2006 |

(Continued)

OTHER PUBLICATIONS

International Search Report corresponding to PCT Application No. PCT/EP2010/067879, mailed Dec. 29, 2011 (German and English language document) (5 pages).

*Primary Examiner* — Courtney Smith
*Assistant Examiner* — Rashen E Morrison
(74) *Attorney, Agent, or Firm* — Maginot, Moore & Beck LLP

(57) ABSTRACT

A machine tool having a drive motor includes an electronic unit and a switch for switching the drive motor on/off. An additional contact module is connected to the electronic unit, the drive motor being electrically connected only to the contact module. Also, the switch is connected to the contact module.

12 Claims, 2 Drawing Sheets

(56) References Cited

U.S. PATENT DOCUMENTS

| | | | | |
|---|---|---|---|---|
| 7,021,399 | B2 * | 4/2006 | Driessen | 173/29 |
| 7,281,591 | B2 * | 10/2007 | Bone | 173/217 |
| 7,314,097 | B2 * | 1/2008 | Jenner et al. | 173/48 |
| 7,770,660 | B2 * | 8/2010 | Schroeder et al. | 173/217 |
| 7,817,384 | B2 * | 10/2010 | Woods et al. | 361/33 |
| 8,591,242 | B2 * | 11/2013 | Heinzen et al. | 439/248 |
| 2004/0211576 | A1 * | 10/2004 | Milbourne et al. | 173/48 |
| 2005/0218186 | A1 * | 10/2005 | Forster | 227/133 |
| 2005/0279517 | A1 * | 12/2005 | Hoffman et al. | 173/29 |
| 2006/0086517 | A1 * | 4/2006 | Bone | 173/217 |
| 2006/0185866 | A1 * | 8/2006 | Jung et al. | 173/48 |
| 2006/0237207 | A1 * | 10/2006 | Britz et al. | 173/217 |
| 2007/0133183 | A1 * | 6/2007 | Urbach et al. | 361/760 |
| 2009/0021090 | A1 * | 1/2009 | Du et al. | 310/50 |
| 2009/0224703 | A1 * | 9/2009 | Woods et al. | 318/17 |
| 2011/0078910 | A1 * | 4/2011 | Tomita et al. | 30/381 |
| 2012/0074881 | A1 * | 3/2012 | Pant | 318/400.09 |
| 2013/0033846 | A1 * | 2/2013 | Allner et al. | 361/827 |

FOREIGN PATENT DOCUMENTS

| | | | |
|---|---|---|---|
| CN | 101474787 | A | 7/2009 |
| DE | 31 47 418 | A1 | 6/1983 |
| EP | 0 235 735 | A1 | 9/1987 |
| EP | 2 062 700 | A2 | 5/2009 |
| RU | 2 366 565 | C2 | 9/2009 |

* cited by examiner

MACHINE TOOL HAVING A DRIVE MOTOR

This application is a 35 U.S.C. §371 National Stage Application of PCT/EP2010/067879, filed on Nov. 22, 2010, which claims the benefit of priority to Serial No. DE 10 2009 054 967.6, filed on Dec. 18, 2009 in Germany, the disclosures of which are incorporated herein by reference in their entirety.

The disclosure relates to a machine tool having an electric drive motor, in particular a handheld machine tool.

BACKGROUND

Electric tools have, in a housing, various electrical and electronic components, for example an electric motor, electronics units, switches etc., which are connected to one another by means of electrical cables. In the process, care should be taken to route the cable in an ergonomic manner, in order to keep the effort required for assembling the electric tool as low as possible while at the same time providing a high level of reliability in respect of assembly. Further criteria are orderly arrangement of the cables such that installation space is optimized, in order to minimize the possibility of dirt and dust, which are produced when processing workpieces, for example, being deposited and also in order to keep the required installation space as low as possible. Furthermore, it should be possible to carry out repairs in a simple manner. The electrical and electronic components generally have to satisfy high loading requirements both in a mechanical and in an electrical respect.

SUMMARY

The disclosure is based on the object of providing an electric machine tool with a simplified cable routing arrangement between the electrical and electronic components in the housing of the machine tool using simple measures.

According to the disclosure, this object is achieved by virtue of the features set forth below. Expedient developments are also set forth below.

The machine tool according to the disclosure has an electric drive motor in a housing, with an electronics unit for controlling the drive motor and a switch for switching on/switching off the drive motor likewise being arranged in or on the housing. The electrical connection between the electronics unit, the switch and the drive motor is established by means of cables. The machine tool is, in particular, a handheld machine tool, for example an angle grinder.

According to the disclosure, an additional contact module which is connected to the electronics unit is provided, said contact module being interconnected between the drive motor, the electronics unit and the switch. The drive motor is connected only to the contact module; an additional, separate connection to the electronics unit is dispensed with. The switch is also preferably connected only to the contact module.

The contact module forms a central structural unit which is connected to the further electrical and/or electronic components, as a result of which the total number of connection options or cables is reduced in comparison to prior art designs. Therefore, separate cabling between the electronics unit and the drive motor is dispensed with in particular; the communication now takes place by means of the contact module. The number of electrical cables required between the various components is restricted to a minimum. This also results in an orderly layout in the housing interior, as a result of which the risk of soiling and the risk of mechanical or electrical damage is considerably reduced. Furthermore, the installation and the repair and/or the replacement of individual components are considerably simplified. The ease of installation and repair is increased by virtue of the reduced number of cables and plug connections since only a few actions are required to install or, if repairs are required, to replace individual components. The risk of the components being combined incorrectly is also reduced or possibly entirely eliminated.

In principle, both a plug connection between the components, in which the individual component housings can be directly electrically contact-connected, and a connection by means of cables, or a combination of plug connections and cable connections, are possible. Therefore, it is possible, in particular, to design the connection between the contact module and the switch for switching on/switching off purposes as a plug connection, and to design the connection between the contact module and the electric motor as a cable connection. Both the plug connection between the switch and the contact module, and the cable connection between the electric motor and the contact module are designed as releasable connections.

The connection between the electronics unit and the contact module can likewise be designed either as a cable connection or as a plug connection. In the case of a cable connection, said cable connection is preferably designed without the option of being released, with a releasable cable connection also being possible in principle.

The contact module forms a contact platform by means of which electrical contact is established between the various electrical and electronic components in the housing. However, the contact module itself can, furthermore, also accommodate electronic components, for example printed circuits or diodes, which perform additional electrical and/or electronic tasks. When the machine tool is switched off, the induced voltage, which is produced during the diminishing rotary movement of the motor, can be conducted to a rechargeable battery by means of the diode, in order to protect the electronics against harmful voltages.

The contact module can also have a switch bridge as further electrical and/or electronic components, said switch bridge being integrated in the contact module housing. It is also possible to integrate components such as inductors, capacitors or the like which are required for radio interference suppression, in particular. A memory unit which stores information, for example the number of operating hours, load profiles, load durations etc., during operation can also be integrated in the contact module.

According to an advantageous embodiment, provision is made for the contact module to be of two-part construction and have two housing parts which can be connected and which are connected to one another by means of an interlocking connection, for example. A separating wall for providing electrical and mechanical insulation can be arranged between the housing parts of the contact module. The separating wall is preferably arranged between the two plug contacts to the motor and increases the air gap or creepage distance between the two potentials of the plug contacts, as a result of which the operational reliability is increased. In addition, metal chips which are produced when workpieces are processed cannot accumulate between the non-insulated regions of the motor plug contacts.

According to a further advantageous embodiment, provision is made for the contact module to additionally be filled with an encapsulation compound which can have both a mechanically protective and an electrically protective function. The internal components are protected by means of the encapsulation compound against electrical bridge formation due to the ingress of dust; the encapsulation compound also provides additional fixing and prevents undesirable vibration of the components.

BRIEF DESCRIPTION OF THE DRAWINGS

Further advantages and expedient embodiments can be gathered from the further claims, the description of the figures and the drawings, in which:

DETAILED DESCRIPTION

Identical components are provided with the same reference symbols in the figures.

Figure 1:
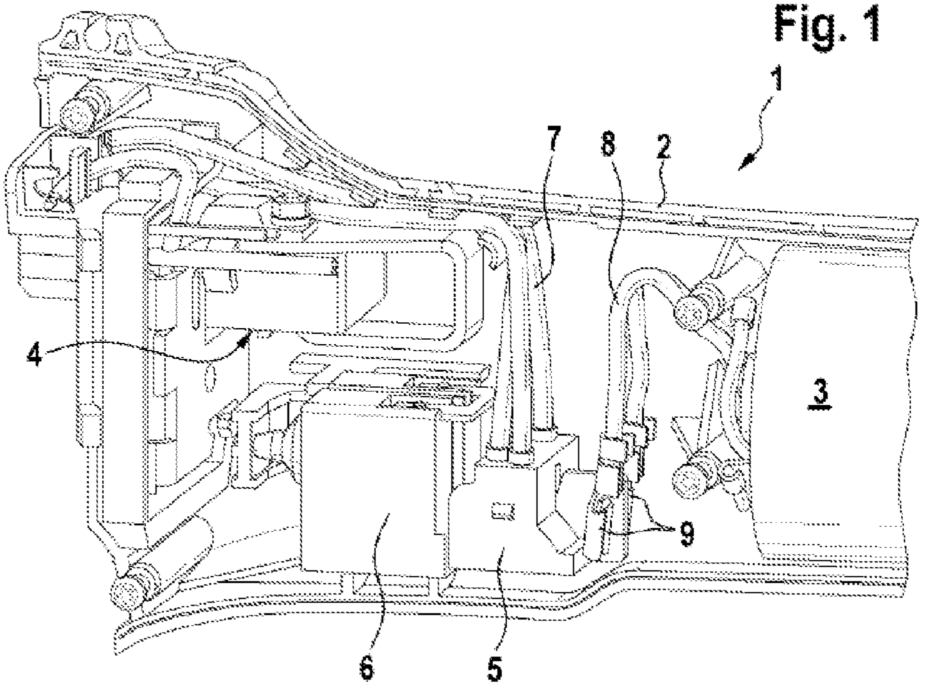
FIG. 1 shows an electric handheld machine tool having an open housing, with an electric drive motor, an electronics unit, a switch for switching on/switching off the drive motor and an additional contact module being integrated in the housing.

FIG. 1 shows an electric handheld machine tool 1 which has an electric drive motor in a housing 2, the drive movement of said electric drive motor being transmitted to a tool shaft for holding a tool by means of a gear unit. The drive motor 3 is controlled by means of an electronics unit 4 which has an associated contact module 5. A switch 6 is used to switch on/switch off the drive motor 3.

The contact module 5 is connected to the electronics unit 4 by means of cables 7. The cable connection is designed as a non-releasable connection, and therefore the electronics unit 4 and the contact module 5 form a combined unit. The contact module 5 has its own contact module housing which contains firstly various electrical connections and secondly further electronic components.

The switch 6 is connected directly and only to the contact module 5, with the connection comprising both an electrical connection and a mechanical connection. The connection is designed as a plug connection; no connecting cables are provided between the switch 6 and the contact module 5.

The electrical connection between the drive motor 3 and the contact module 5 is established by means of further cables 8 which form a releasable cable connection by the two cables 8 being connected to sides of the contact module 5 by means of clamps 9. The electric drive motor 3 is connected to the contact module 5 only by means of the cables 8; there are no further cable connections from or to the drive motor 3.

Figure 2:
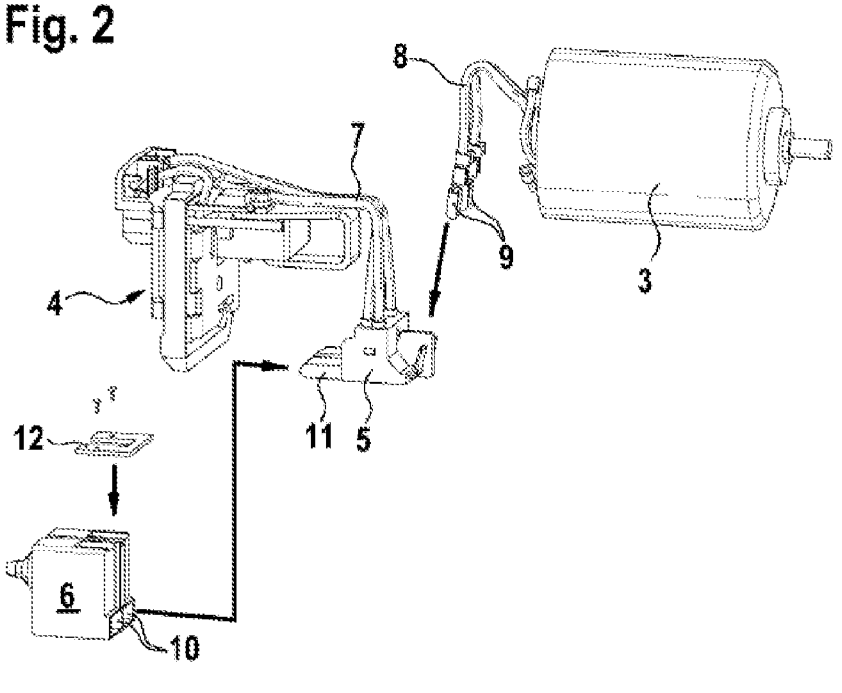
FIG. 2 shows, in separate illustrations, the electric drive motor, the electronics unit having the contact module, and the switch.

FIG. 2 shows the drive motor 3, the electronics unit 4, the contact module 5 and the switch 6 in separate illustrations, with the dashed arrows indicating the mounting direction. Plug openings 10, which are plugged onto a plug projection 11 on the housing of the contact module 5, are located on the housing of the switch 6. The electrical connection between the switch 6 and the contact module 5 is established by means of a U-shaped plug contact part 12.

Figure 3:
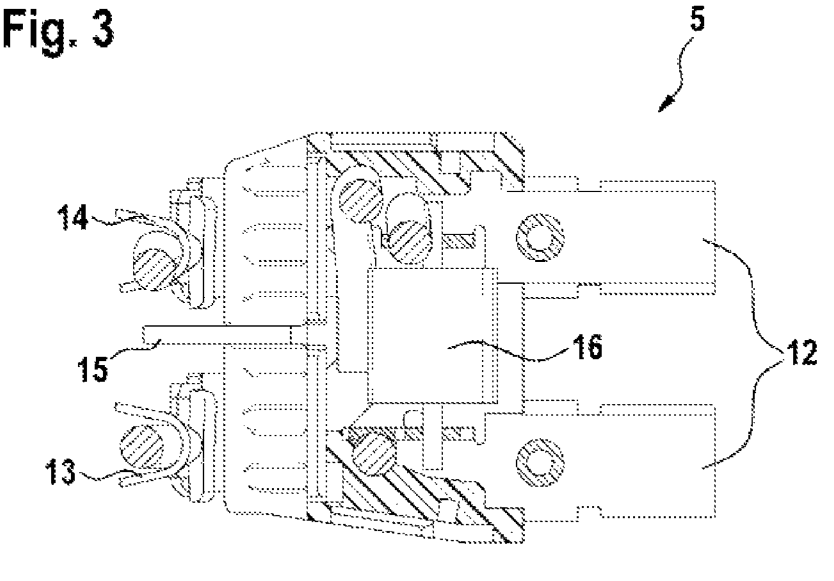
FIG. 3 shows an illustration of the layout of the contact module.

FIG. 3 shows the contact module 5 in a separate illustration. Two electrical plug contacts 13 and 14 for the connection of the cables from the drive motor are located on the housing of the contact module 5. A separating wall 15 is integrated in the housing between the plug contacts 13 and 14, said separating wall increasing the air gap or creepage distance between the two potentials of the plug contacts. The risk of electrically conductive metal chips being deposited is also reduced.

Further electronic components can be accommodated in the interior of the housing of the contact module 5. In the exemplary embodiment, a diode 16 is located in the housing of the contact module.

Figure 4:
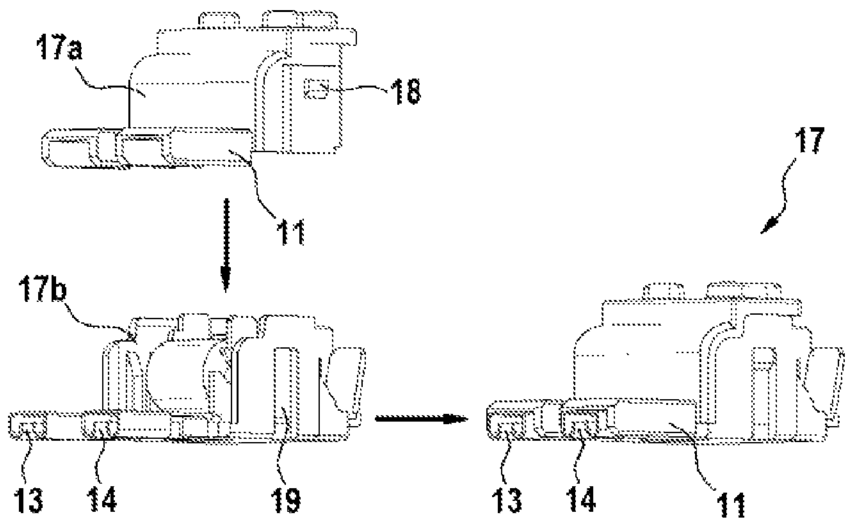
FIG. 4 shows an illustration of the two-part housing of the contact module by way of a top part and bottom part, and in the assembled state.

As shown in FIG. 4, the housing 17 of the contact module is of two-part design and comprises an upper housing part 17*a* and a lower housing part 17*b*, it being possible for these parts to be connected to one another by means of a latching or interlocking connection. In the exemplary embodiment, the latching connection is provided with a latching lug 18 on the upper housing part 17*a*, the intention being to move said latching lug into a latched position with a latching recess 19 in the lower housing part 17*b*.

Various electrical plug connections or other electrical connecting parts and electronics components are located inside the housing of the contact module.

The invention claimed is:

1. A machine tool, comprising:

a contact module including a first contact region, a second contact region, and a third contact region;

an electric drive motor directly electrically connected only to the contact module, the electric drive motor being directly physically and electrically connected to the first contact region;

an electronics unit connected to the contact module at the second contact region, the electronics unit controlling the drive motor; and a switch external to the contact module and connected to the contact module at the third contact region, the switch controlling an on/off state of the electric drive motor, wherein the electronics unit is electrically connected to the switch by first cables, and the switch is electrically connected to the electric drive motor through the contact module by second cables.

2. The machine tool as claimed in claim 1, wherein the second contact region of the contact module is connected to the electronics unit by the first cables.

3. The machine tool as claimed in claim 1, wherein the second contact region of the contact module is fixedly connected to the electronics unit.

4. A machine tool, comprising:

a contact module including a first contact region, a second contact region, and a third contact region;

an electric drive motor directly electrically connected only to the contact module, the electric drive motor being directly physically and electrically connected to the first contact region;

an electronics unit connected to the contact module at the second contact region, the electronics unit controlling the drive motor; and a switch connected to the contact module at the third contact region, the switch controlling an on/off state of the electric drive motor, wherein the electronics unit is electrically connected to the second contact region by first cables, and the switch is electrically connected to the electric drive motor through the contact module by second cables, and wherein the switch and the third contact region of the contact module are connected to one another by a releasable plug connection.

5. The machine tool as claimed in claim 1, wherein the drive motor is connected to the first contact region of the contact module by a releasable cable connection.

6. The machine tool as claimed in claim 1, wherein the contact module includes additional electronic components.

7. The machine tool as claimed in claim 1, wherein the contact module is designed in two parts with two housing parts configured to be connected.

8. The machine tool as claimed in claim 7, wherein the housing parts of the contact module are connected to one another by an interlocking connection.

9. The machine tool as claimed in claim 7, further comprising a separating wall arranged between the two housing parts and configured to provide electrical and mechanical insulation between the two housing parts.

10. The machine tool as claimed in claim 1, wherein the contact module is filled with an encapsulation compound.

11. The machine tool as claimed in claim 6, wherein the additional electronic components include a printed circuit.

12. The machine tool as claimed in claim 6, wherein the additional electronic components include a diode.

* * * * *